United States Patent [19]

Middelhoek et al.

[11] 3,760,492

[45] Sept. 25, 1973

[54] PROCEDURE FOR MAKING SEMICONDUCTOR DEVICES OF SMALL DIMENSIONS

[76] Inventors: Simon Middelhoek, Eggstrasse 9, Adliswil/Zurich; Giovanni Sasso, Mutschellenstrasse 179, Zurich, both of Switzerland

[22] Filed: Jan. 8, 1971

[21] Appl. No.: 105,073

Related U.S. Application Data

[62] Division of Ser. No. 827,495, May 22, 1969, Pat. No. 3,669,732.

[52] U.S. Cl. ........................ 29/571, 29/578, 29/589

[51] Int. Cl. ........................ B01j 17/00

[58] Field of Search ........................ 29/571; 317/235 L, 317/235 M, 235 U

[56] References Cited

UNITED STATES PATENTS

| | | | |
|---|---|---|---|
| 3,483,096 | 12/1969 | Gri et al. | 317/234 M |
| 3,483,610 | 12/1969 | Campo | 317/234 M |
| 3,578,514 | 5/1971 | Lesk | 29/571 |

OTHER PUBLICATIONS

IBM Technical Disclosure, De Witt, Vol. 9, No. 1, June 1966, page 102.

IBM Technical Disclosure, Muench, Vol. 10, No. 3, August 1967, page 335.

*Primary Examiner*—Charles W. Lanham
*Assistant Examiner*—W. Tupman
*Attorney*—Maurice H. Klitzman

[57] ABSTRACT

A method for making a high speed field effect transistor of the planar type with Schottky-barrier or junction contacts, in which all apertures required for production of electrodes in an insulating layer covering the semiconductor body are produced simultaneously.

A field effect transistor in which the gate electrode surrounds the drain electrode in a loop while the source electrode is subdivided and its parts essentially surround the gate electrode. The contact lands of the gate electrode are arranged essentially outside the region of capacitive influence of the source electrode.

16 Claims, 6 Drawing Figures

PROCEDURE FOR MAKING SEMICONDUCTOR DEVICES OF SMALL DIMENSIONS

CROSS REFERENCE TO A RELATED APPLICATION

This is a division of an application of Simon Middelhoek et al., Ser. No. 827,495, filed May 22, 1969, entitled "Procedure for Making Semiconductor Devices of Small Dimensions" and now U.S. Pat. No. 3,669,732.

BACKGROUND OF THE INVENTION

1. Field of the Invention

The invention pertains to a method for making novel semiconductor devices of small dimensions, and more particularly to the making of planar field effect transistors. Specifically, the method is well-suited for making field effect transistors having a Schottky-barrier gate.

2. Description of the Prior Art

In known methods for making Schottky-barrier field effect transistors in planar technology it is common first to produce a conductive layer on the surface of an intrinsic or high ohmic substrate of semiconductor material, e.g., silicon. Thereupon the silicon surface is oxidized, e.g., by placing the silicon in an oxygen atmosphere, in which water vapor is present. Windows for the source and drain electrodes are then etched into the resulting $SiO_2$ by means of known photoetch procedures. The source and drain electrodes are ohmic contacts and are made, e.g., by vapor deposition of an alloying material such as gold-antimony. The gold-antimony layer is alloyed into the silicon at elevated temperatures. Subsequently, another photoetch process is carried out to open a window for the gate contact. This window is located between the completed source and drain contacts. For producing a Schottky-barrier gate contact gold is deposited, but not alloyed, onto the surface.

Difficulties were experienced with these methods when the width of the gate contact in direction of the current flow between source and drain became extremely small, e.g., below 3 microns. As the $SiO_2$ surface of the transistor had already been etched to provide windows for source and drain electrodes it was no longer a homogeneous surface. Therefore, it was not possible to apply the photoresist in a completely uniform manner and the deposited photoresist layer varied in thickness. Since the light sensitivity of a photoresist layer is dependent upon the thickness of the layer, non-uniform light sensitivity would result. This in turn affects the definition of very fine patterns, e.g., a gate electrode of one micron or less width is difficult to achieve.

Accordingly, a primary object of this invention is to make a field effect transistor having a gate width smaller than that possible using present day methods.

Another object is to provide an improved transistor fabricating method well suited for application to the fabricating of integrated circuits.

Another object is to produce a transistor having a very low gate resistance, i.e., the resistance of the gate electrode in the direction of its greatest extension is very low.

A further object is to make a transistor simply and with only a small number of fabrication steps.

A still further object is to provide a transistor fabricating process which does not require precise mask alignment.

An additional object is to provide a method for making transistors which do not require special contact lands for each electrode.

A further object is to produce an improved transistor whose gate electrode has a very high breakdown voltage.

A still further object of this invention is to provide an improved high speed transistor, of the field effect type, which has very small gate width, yet minimal source-to-gate capacitance.

SUMMARY OF THE INVENTION

The inventive method overcomes the aforementioned difficulties by producing the apertures required for making the electrodes in the insulating layer covering the semiconductor body simultaneously in a common step, e.g., in one single photomasking and etching process.

Preferably, for making a silicon field effect transistor of the Schottky-barrier type, Schottky-barrier contacts only are produced in the apertures. Thereupon the source and drain electrodes are converted into ohmic contacts while the gate electrode is covered with a mask.

Alternatively, the aperture for the gate electrode is masked while the source and drain electrodes are deposited in the respective apertures by evaporation of chromium and gold-antimony and alloying these layers in a heat treatment. Subsequently, gold is deposited in the gate window.

Alternatively, by selective diffusion of doping materials in selected windows the conductivity of the semiconductor material is modified so that the subsequent deposition of metal in the windows produces electrodes of a first kind in the selected windows and electrodes of a second kind in all other windows.

In a semiconductor device made in accordance with the before-referred to method a control electrode encloses a first electrode of another type in a loop. The control electrode advantageously has at least two contact points. The parts of a second subdivided electrode of another kind essentially surround the control electrode. The contact lands of the control electrode are arranged essentially outside the region of the capacitive influence of this second electrode.

The inventive method as well as the device produced by it will now be explained in detail by means of examples. It is obvious that those skilled in the art will easily find numerous other ways for embodiments without thereby departing from the spirit of invention.

The foregoing and other objects, features and advantages of the invention will be apparent from the following more particular description of preferred embodiments of the invention, as illustrated in the accompanying drawings.

DRAWINGS

Figure 1:
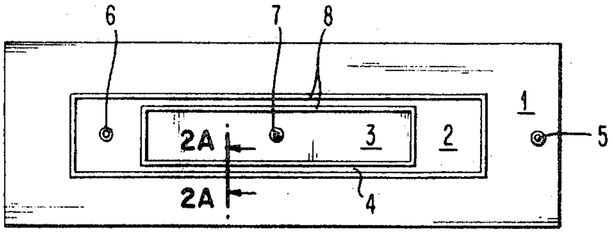
FIG. 1 PRIOR ART
FIG. 1 is a top-view of a first embodiment of a field effect transistor of known geometry.
Figure 3:
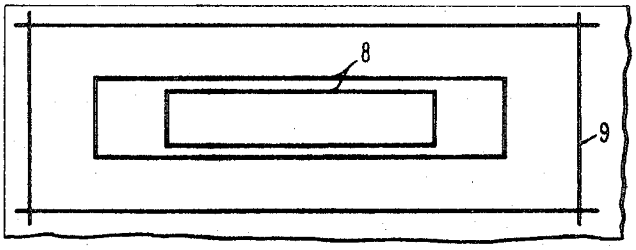
Figure 4:
Figure 5:

FIGS. 3, 4 and 5 comprise masks which are useful for making the transistor referred to in FIG. 1.

Figure 6:
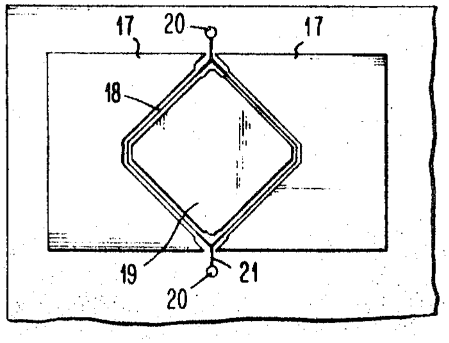

FIG. 6 is a further embodiment of a field effect transistor.

DETAILED DESCRIPTION

Figure 2A:
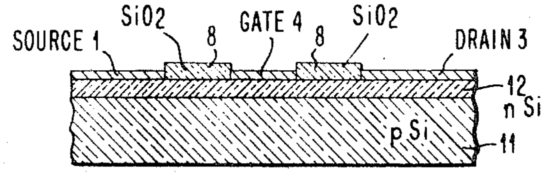
FIG. 2A is a cross-sectional view taken on the line 2A—2A of FIG. 1 illustrating an active part of this field effect transistor.

Referring to FIGS. 1 and 2, the procedure starts with the high ohmic P-conductive silicon substrate 11. The substrate preferably has a conductivity of 1,000 Ω-cm and consists of silicon which is doped, e.g., with $1.5 \times 10^{13}$ per $cm^3$ of suitable P-type dopant. It should be evident to those skilled in the art that the starting material can be of N-type conductivity and the conductivity types of the remaining materials can be opposite that shown in the drawing. The thickness of the substrate usually is in order of 0.2 mm. Upon the substrate 11 a high conductivity N-type channel layer 12 is deposited epitaxially. This layer is doped with $10^{17}$ atoms per $cm^3$ of a suitable N-type dopant and exhibits a conductivity of 0.1 Ω cm and has a thickness of e.g., 0.1 μ. On this layer 12 the continuous layer 8 of $SiO_2$ is produced. This may be done either by sputtering or preferably by oxidation of silicon in a hydrogen and vapor atmosphere at elevated temperature, e.g., 1,000° – 1,100°C. The oxide surface is covered in a known way with photoresist and by means of a mask the parts 1, 2 and 3 required for source-, gate- and drain electrodes, are exposed simultaneously. The photoresist then is developed and the exposed areas of the layer are removed in an appropriate solvent. There remains only the frame-like strips 8 and the border line strips 9 whereas the entire remaining $SiO_2$ surface is etched away, e.g., in buffered hydrofluoric acid, in a well-known manner.

It is to be observed that the windows in the oxide surface for all three electrodes of the field effect transistor, i.e., for source, gate and drain are produced simultaneously in one and the same photo-etch operation. For this solitary operation the photoresist is applied upon the completely uniform, plane and smooth $SiO_2$ surface. A completely uniform layer of photoresist of equal thickness results. Only such a layer is able to resolve the extremely fine lines required. For example, the bridges 8 have a width in the order of 1 μ or less. The mask for this process is depicted in FIG. 3. The border line 9 in FIG. 3 serves for delimiting the transistor from neighboring devices on the same substrate.

A chromium layer of thickness of 50 A is deposited first upon the exposed silicon surfaces 1, 2 and 3, e.g., by means of a known vapor deposition procedure. On top of the chromium layer a second layer is applied which consists of nickel and is about 150 A thick. Alternatively, a layer of gold of a thickness of 20 A may be deposited on the chromium prior to the application of the nickel layer. The nickel layer may in turn be clad by a gold layer of 20 A. It is the purpose of the chromium layer to provide a smooth support and good attachment for the nickel. Furthermore, it avoids the risk of coagulation of the subsequent gold, The nickel produces a Schottky-barrier contact on the underlying silicon layer. The purpose of the gold deposits are to compensate for the so-called snow plow effect. Metal layers having the following thickness ranges are most useful: chromium 20 to 100 A and nickel 70 to 300 A.

The snow plow effect is a known undesirable side effect in the manufacture of semiconductor devices. It is caused by the difference in affinity to most doping materials between metallic silicon and $SiO_2$. In the present case the channel layer 12 had been doped with arsenic and the oxidation, in which part of the silicon is consumed by conversion into oxide, will push back part of the doping material. The result is an undesirably high concentration of doping material just underneath the oxide-silicon junction. The conductivity of the channel layer in consequence rises to an undesirable amount. Because gold has the property of reducing the conductivity of doped silicon, the effect is essentially compensated. Of course, the gold only becomes active if it has diffused into the silicon. An appropriate thermal treatment remains to be described.

Up to now, the open silicon surfaces have been covered by a thin chromium layer, a very thin gold layer, a somewhat bigger nickel layer and a second very thin gold layer. These metals, however, cover only the exposed silicon areas because the oxide bridges 8 remain clad by photoresist during these depositions. The photoresist is removed after vapor deposition, which causes the overlaying metal layers to disappear. All free surfaces of the semiconductor, i.e., the areas for source, gate and drain electrodes are now provided with Schottky-barrier contacts.

A new layer of photoresist is now applied over the entire surface of the transistor. This new layer is covered with the mask depicted in FIG. 4 which allows illumination of a part of the source and a part of the drain surface. It may be observed that this mask, as is apparent by comparison of FIG. 4 and FIG. 3, in its dimensions is designed in a way that even with smallest dimensions of the bridges 8 an alignment problem practically does not exist since even a large misalignment of the mask of FIG. 4 still provides sufficient coverage of the pattern produced by the mask of FIG. 3. In other words, it is sufficient that the window 15 of the mask of FIG. 4 is placed within the drain zone 3 of FIG. 1, and that the area 16 covers the entire area of the gate electrode 2. In those areas of the surface of the transistor that are left free by the mask of FIG. 4, layers of 30 A chromium, 300 A gold to which 1 percent antimony is added and a final 10 A chromium are subsequently deposited. The photoresist now is removed in an appropriate solvent. The transistor is submitted to a heat treatment at 500° C for alloying of the source and drain zones. Metal layers having the following thickness ranges are most useful: chromium 10 to 60 A, gold-antimony 100 to 600 A and the final layer of chromium 5 to 20 A. The gold-antimony may contain from 0.5 to 4 percent antimony. The heat treatment may be performed within a temperature range of from 350° to 550° C.

The aforementioned metal layers serve the following purpose: The 30 A chromium layer provides good adhesion for the subsequent deposit of gold. The gold itself will be alloyed into the underlying layers and serves as carrier for the antimony. The final overlying very thin chromium layer serves as protection for the gold-antimony underneath. It avoids the possibility of production of gold scourings that might contaminate other parts of the device.

It has been observed that the above technique causes the gold and the active antimony to spread very easily over the semiconductor surface under the mask. It appears that the gold acts in the fashion of a surface wetting agent. As a result of this phenomenon, it has been found that masking is facilitated because mask apertures may be used which are much smaller than the surface to be gold plated. This has notably reduced the difficulty in mask alignment. For example, the first mask depicted in FIG. 3 may thereby be allowed to overlap the second mask depicted in FIG. 4. Even though the second mask covers a portion of the active electrode surface area to be treated, the gold and antimony will spread over the entire surface during the heat treating step. In practice, the second mask may be made so as to cover the entire transistor with the exception of small apertures over the drain and source electrode areas.

As previously indicated, the metallizations of the individual electrodes are re-inforced galvanically by well-known procedures and the connections 5, 6 and 7 are produced. For completion, the entire surface of the transistor may be neutralized; e.g. by sputter deposition of a relative thick layer of $SiO_2$ or another suitable glass. This measure, however, is not absolutely required because no sensitive junction or open semiconductor material is exposed. The transistor is now ready for use. The enclosed electrode geometry of the transistor shown in FIG. 1 is well suited to integrated circuits because the outer electrode is often connected to ground.

SECOND EMBODIMENT OF METHOD

The procedure to begin with is the same as described above in connection with the first embodiment, i.e., the windows in the oxide layer for source, gate and drain are opened simultaneously. Thereupon the remainders of photoresist are removed and a new layer of photoresist is applied. This is exposed by means of the mask depicted in FIG. 4. In illuminated areas the photoresist is selectively removed. A first layer of chromium having a thickness of about 10 A and a second layer of gold with addition of 1 percent antimony having a thickness of about 300 A are then deposited. These layers are deposited both in the windows where the photoresist is removed and also on top of the remaining photoresist. The remaining photoresist is then dissolved, causing the metal layer on top of it to disappear. The dissolving of the photoresist reopens the window for the gate electrode. The transistor is now subjected to a heat treatment at 500° C, causing the metal layers in source and drain zones to alloy so that the contacts in these places become ohmic. As described in connection with the first embodiment, the gold will spread over the entire area of these electrodes. After alloying, a layer of pure gold 300 A thick is deposited. Chromium, as it was used in the first embodiment, is not applicable here because it would cause the gold to stick on oxide-clad areas. The gold layer produces a Schottky-contact electrode in the open gate window. The new layer does not adhere well on the existing metal layers in the source and drain area or on the oxide bridges 8 and it may be removed, e.g., by wiping with a cotton tip. To compensate for the snow plow effect, some gold may be diffused into the silicon in the gate area by a second thermal treatment.

In the second embodiment of the method which has just been described, metal layers having the following thicknesses are most useful: Chromium 5 to 20 A, gold-antimony 100 to 600 A, gold deposited in the gate area: 100 to 600 A. The gold antimony may contain from 0.5 to 4 percent antimony. The heat treatment may be performed within a temperature range of from 350° to 550° C.

The transistor is now completed and the metal layers constituting the electrodes may be reinforced galvanically in a well-known manner and the required contacts applied. The surface of the transistor may be neutralized, e.g., by application of a glass covering.

THIRD EMBODIMENT OF METHOD

This procedure begins in the same way as described in connection with the first embodiment. Windows for source, gate and drain electrodes are etched simultaneously in a single step into the $SiO_2$ which covers the channel layer supported by a silicon substrate.

In a short oxidation process, a thin layer of about 100 A $SiO_2$ is now produced in the newly opened windows. Thereupon a mask as depicted in FIG. 5 is applied which covers the surface of the gate electrode and the surrounding $SiO_2$ bridges 8. In a photo etch process the new thin $SiO_2$ layer is removed over both the source and drain electrodes.

The last mentioned masking operation requires an alignment step. This, however, is not particularly difficult, since the width of the oxide bridges 8 of e.g., 1 μm is available as tolerance.

In a further step, a diffusion is made in the open windows 1 and 3 for source and drain whereby phosphorus in a concentration of $10^{-19}$ atoms/cm$^3$ is diffused at a temperature of 1,000° C. A concentration range of $10^{-20}$ to $10^{-19}$ atoms per cm$^3$ has been found most useful.

Finally, without further masking of the surface, the transistor is etched in buffered hydrofluoric acid for a time just sufficient to remove the thin $SiO_2$ layer which still covers the gate electrode 2. The relatively thick layer on the insulating bridges 8 will only slightly be attacked in this step. A layer of pure gold 300 A thick is now deposited. This produces a Schottky-barrier contact on the low ohmic N-conductive silicon of the gate electrode and an ohmic contact on the $N^+$ silicon of both source and drain electrodes. The transistor is then heat treated to allow the gold to diffuse into the silicon. In the third embodiment of the method which has just been described, the gold layer may be from 100 to 600 A thick and the heat treating may be performed within a temperature range of from 350° to 550° C.

Finally, the electrode metallizations of the transistor, as already described, are reinforced galvanically and contacts are applied. The entire surface may again be neutralized by application of a glass or other protective layer.

Among the three embodiments described in the foregoing, the last one is the most critical with regard to mask alignment. In the first place, the tolerance provided by the width of the bridges is small compared with the large tolerance zone available in embodiments 1 and 2. Secondly, the diffusion into the semiconductor material does not spread sideways underneath the mask as was the case with the alloying surface diffusion used in the first two embodiments. Therefore, care must be taken that the mask covers as little of the active electrode areas as possible.

SECOND DEVICE EMBODIMENT

The embodiments of the process described above were based on a first device embodiment of the transistor, the geometric configuration of which is shown in FIG. 1, and is conditioned by the geometric form of the mask depicted in FIGS. 3, 4 and 5 respectively. This configuration of a field effect transistor may exhibit drawbacks under certain conditions. In particular, for the application of the transistor in very fast circuits the relatively large capacity toward the source electrode caused by the large lands at both ends of the gate electrode are of disadvantage.

The configuration shown in FIG. 6 avoids this problem. In this configuration, the source electrode is divided into two halves 17. The gate electrode 18 is arranged in a loop like fashion, as was the case in the first embodiment, and completely surrounds the drain electrode 19. The gate electrode is particularly narrow and longitudinally extended. Its connections are drawn out of the region of the source electrode and the lands 20 required for application of contact lines are placed at some distance from the source metallization. The contact lands are kept as small as possible, i.e., just large enough to connect a wire. The line 21 leading to the active part of the gate electrode is reinforced to avoid a possible bad influence of an elevated resistance of this line.

To be note particularly in this embodiment is the fact that the source electrode essentially completely surrounds the loop formed by the gate. In all places where the gate is opposite the drain, or a part of it, a part of the source electrode is present outside of the gate. This results in as complete as possible a blockage of the source-gate-drain current path if the gate is appropriately biased.

As has been mentioned already the good characteristics of the transistor among others are achieved by the fact that the gate electrode in its extension between source and drain is as narrow as possible. However, a conductor of such narrow dimensions, where the width may be 1 micron or less, is very sensitive and even small disturbances in the process may cause its interruption. The loop-like design makes it possible to tolerate an interruption of the gate electrode because it is improbable that both parts of the loop-shaped gate would be interrupted simultaneously. Furthermore, the longitudinal resistance of the gate, i.e., the resistance in the biggest extension of the gate may be reduced considerably if the feed-line leading to the gate is connected at two points simultaneously.

It is obvious that the two halves 17 of the source electrode have to be interconnected, i.e., the line leading to the source has to be connected to both halves simultaneously. The connection points on source and drain, not represented in FIG. 6, are positioned similarly as the connection points 5 and 7 in FIG. 1. Furthermore, it is obvious that the source and drain electrodes according to the external connection of the transistor may be interchanged. Both electrodes are ohmic contacts to the semiconductor of the transistor; and, therefore, the source may be used as drain and the drain as source electrode. Finally, it is obvious how the masks depicted in FIGS. 3, 4 and 5 have to be designed for the manufacture of the just described second embodiment of the transistor.

While the invention has been particularly shown and described wih reference to a few preferred embodiments thereof, it will be understood by those skilled in the art that the foregoing and other changes in form and detail may be made therein and other materials than those mentioned may be used without departing from the spirit and scope of the invention.

What is claimed is:

1. Method of making a field effect transistor comprising the steps of:

forming a channel layer of high conductivity semiconductor material on a substrate of opposite conductivity type;

forming an insulating layer on said channel layer;

simultaneously removing portions of said insulating layer in a single removing operation to expose spaced source, drain, and gate areas in said channel layer;

forming metal contacts in each of said source, drain and gate areas.

2. A method according to claim 1 wherein forming of the metal contacts comprises the steps of:

depositing contacts of a first kind in each of said source, drain, and gate areas; and converting said contacts of said first kind in said source and drain areas into contacts of a second kind.

3. A method according to claim 2 wherein said contacts of said first kind are schottky barrier contacts and said contacts of said second kind are ohmic contacts.

4. A method according to claim 3 wherein said contacts are produced by the steps of:

forming the schottky barrier contacts by depositing a first layer of chromium and a layer of nickel into each of said source, drain and gate areas;

covering the gate area with a mask;

converting the schottky barrier contacts so formed in the source and drain areas into ohmic contacts by depositing a second layer of chromium, a layer of gold-antimony, and a third layer of chromium into the source and drain areas; and heat treating the transistor at a temperature sufficient to allow the diffusion of the gold-antimony through the underlying layers, whereby the gold-antimony alloys with the channel layer to form ohmic contacts in the source and drain areas.

5. A method according to claim 4 wherein said first layer of chromium has a thickness range of from 20 to 100A; said layer of nickel has a thickness range of from 70 to 300A; said second layer of chromium has a thickness range of from 10 to 60A; said layer of gold-antimony comprises 0.5 to 4 per cent antimony and has a thickness range from 100 to 600A; said third layer of chromium has a thickness range of from 5 to 20A; and said heat treating is accomplished within a temperature range of from 350° to 550° C.

6. A method according to claim 4 wherein the steps of forming schottky barrier contacts comprise the additional step of depositing a layer of gold on top of said layer of nickel in each of said source, drain and gate areas.

7. A method according to claim 4 wherein the steps of forming schottky barrier contacts comprise the additional step of depositing a layer of gold on top of said first layer of chromium.

8. A method according to claim 1 wherein the forming of metal contacts comprises the steps of:

depositing contacts of a first kind in said source and drain areas; and depositing a contact of a second kind in said gate area.

9. A method according to claim 8 wherein said contacts of said first kind are ohmic contacts and said contact of said second kind is a schottky barrier contact.

10. A method according to claim 9 wherein said contacts are formed by the steps of:

producing ohmic contacts in said source and drain areas by depositing a layer of chromium and a layer of gold-antimony into said source and drain areas;
heat treating the transistor at a temperature sufficient to allow diffusion of the gold-antimony into the silicon whereby the gold-antimony alloys with the channel layer to form ohmic contacts in said source and drain areas;
depositing a layer of gold into the gate area, thereby forming a schottky barrier contact in said gate area.

11. A method according to claim 10 wherein said layer of chromium has a thickness range of from 5 to 20A;
said layer of gold-antimony comprises 0.5 to 4 per cent antimony and has a thickness of from 100 to 600A;
said heat treating is accomplished within a temperature range of from 400° to 600° C; and
said layer of gold deposited in the gate area has a thickness range of from 100 to 600A.

12. A method according to claim 10 which comprises the additional step of heat treating the transistor after said layer of gold has been deposited into the gate area.

13. A method according to claim 1 wherein said depositing of metal contacts comprises the steps of:
diffusing a doping material of the same conductivity type as said channel layer into said source and drain areas; and
depositing in the source, drain, and gate areas at least one layer of metal, thereby forming a schottky barrier contact in said gate area, and ohmic contacts in said source and drain areas.

14. A method according to claim 13 further comprising the steps of:
masking the gate area prior to diffusing the doping material by generating a comparatively thin silicon dioxide layer in said gate area; and
removing said silicon dioxide layer from the gate area after diffusing the doping material.

15. A method according to claim 13 wherein said doping material is phosphorus with a concentration range of between $10^{-20}$ to $10^{-19}$ atoms per $cm^3$ in said channel layer; and one of said layers of metal is gold having a thickness of from 100 to 600A.

16. A method according to claim 13 which comprises the additional step of heat treating the transistor after one of said layers of metal has been deposited into the source, drain and gate areas.

* * * * *

UNITED STATES PATENT OFFICE

CERTIFICATE OF CORRECTION

Patent No. 3,760,492 Dated September 25, 1973

Inventor(s) Simon Middelhoek and Giovanni Sasso

It is certified that error appears in the above-identified patent and that said Letters Patent are hereby corrected as shown below:

Title Page, [73], should read --International Business Machines Corporation, Armonk, NY--.

Signed and sealed this 8th day of October 1974.

(SEAL)
Attest:

McCOY M. GIBSON JR.
Attesting Officer

C. MARSHALL DANN
Commissioner of Patents

SZ9-68-005B